(12) United States Patent
Liu

(10) Patent No.: US 6,188,292 B1
(45) Date of Patent: Feb. 13, 2001

(54) TWO INTERCONNECTED OSCILLATORS HAVING ADJUSTABLE COUPLING FOR CONTROLLING FREQUENCY

(75) Inventor: Ting-Ping Liu, Holmdel, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/400,594

(22) Filed: Sep. 21, 1999

(51) Int. Cl.$^7$ .............................. H03B 27/00; H03B 28/00
(52) U.S. Cl. ................................. 331/45; 331/48; 331/52; 331/55; 331/177 R
(58) Field of Search .................................. 331/46, 47, 48, 331/50, 55, 177 R, 45, 52

(56) References Cited

U.S. PATENT DOCUMENTS 5,233,315 * 8/1993 Verhoeven ............................. 331/55

* cited by examiner

Primary Examiner—Siegfried H. Grimm

(57) ABSTRACT

A first and a second fixed-frequency oscillator coupled in a ring topology to generate a variable frequency output is provided. Frequency variation is achieved by varying the coupling between the two oscillators. The coupling may be varied by using a variable current or voltage source. The first fixed frequency oscillator may generate a first signal which is ninety degrees out of phase with a second signal generated by the second fixed frequency oscillator. An apparatus is provided comprising a first oscillator which produces a first signal, a second oscillator which produces a second signal which is about ninety degrees out of phase with the first signal, and first and second coupling modules, coupling the first and second oscillators. A frequency control circuit is provided which varies the coupling of the first and second coupling modules and thereby varies the frequency of the first signal and the second signal.

19 Claims, 2 Drawing Sheets

TWO INTERCONNECTED OSCILLATORS HAVING ADJUSTABLE COUPLING FOR CONTROLLING FREQUENCY

FIELD OF THE INVENTION

This invention relates to improved methods and apparatus for controlling the frequency of oscillator circuits.

BACKGROUND OF THE INVENTION

High-frequency voltage controlled oscillators ("VCOs) are widely used in integrated circuits, ranging from clock recovery in high data-rate optical communications to frequency synthesizer in wireless communications. Frequency tuning for these VCOs can be achieved with varactor diodes. However, the frequency tuning range using this approach is limited by low supply voltages on integrated circuits and maximum variable capacitance available to varactors at high frequencies when inductors are used. Other frequency turning approaches include varying the current in the resonator of the oscillator to alter effective capacitance or varying the relative weighing between two different LC (Inductor-Capacitor) resonators. These techniques are not adequate for tuning frequency.

SUMMARY OF THE INVENTION

The present invention can employ a first and a second fixed-frequency oscillator coupled in a ring topology to generate a variable frequency output. Frequency variation can be achieved by varying the coupling between the two oscillators. The coupling may be varied by using a variable current or voltage source. The first fixed frequency oscillator may generate a first signal which is ninety degrees out of phase with a second signal generated by the second fixed frequency oscillator.

In one embodiment an apparatus is provided comprising a first oscillator producing a first signal, a second oscillator producing a second signal about ninety degrees out of phase with the first signal, a first and second coupling modules coupling the first and second oscillators, and a frequency control circuit. The goal is that the first and second signals should be exactly 90 degrees out of phase i.e. in quadrature with respect to one another. In one embodiment the frequency control circuit varies the coupling of the first and second coupling modules to vary the frequency of the first and second signals. The first and second oscillators may be of the same type, such as fixed frequency, inductive and capacitive oscillators. In one embodiment a method is also provided comprising the steps of producing a first signal, producing a second signal which is about ninety degrees out of phase with the first signal, coupling the first signal with the second signal, and varying the coupling of the first signal with the second signal to vary the frequency of the first signal and the second signal.

DETAILED DESCRIPTION OF THE DRAWINGS

Figure 1:
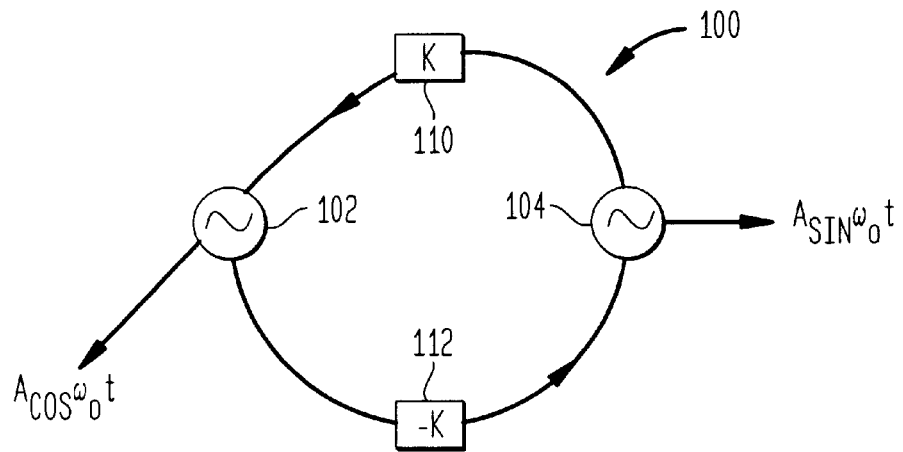
FIG. 1 shows a diagram of a prior art system for generating quadrature currents.

FIG. 1 shows a diagram of a prior art circuit 100 for generating quadrature currents. The circuit 100 is comprised of oscillators 102 and 104 and constant coupling "k" 110, and constant coupling "−k" 112. In operation the oscillator 104 generates a voltage signal: $A\sin\omega_0 t$. The oscillator 102 generates a voltage signal: $A\cos\omega_0 t$. The two signals are 90 degrees out of phase but have the same amplitude. The coupling "k" 110 and "−k" 112 can be implemented in a manner known in the art. The coupling "k" 110 and "−k" 112 of the prior art would be fixed, i.e. there is no control circuitry to vary the coupling "k" 110 or "−k" 112. Both the coupling "k" 110 and "−k" 112 would include a fixed current source.

Figure 2:
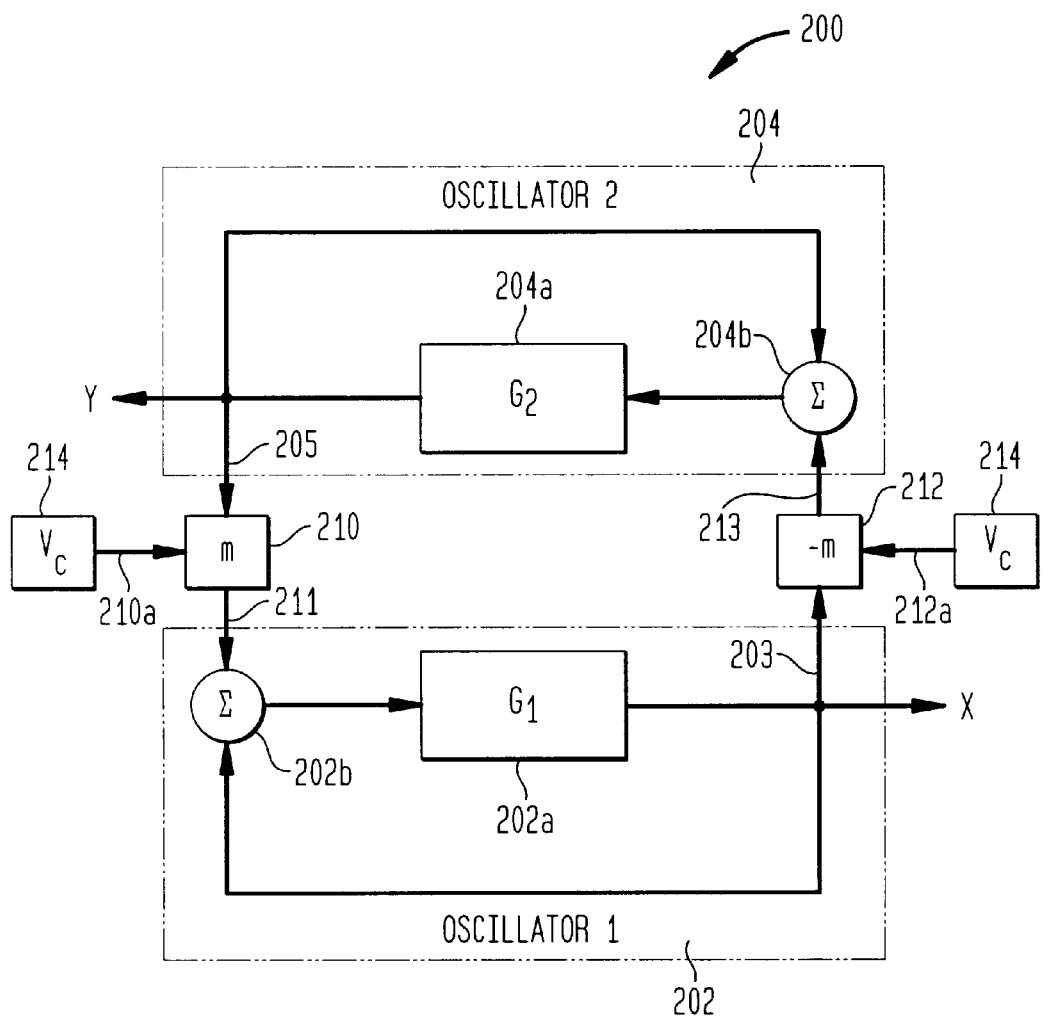
FIG. 2 shows a diagram of a circuit in accordance with an embodiment of the present invention in which quadrature voltages are generated and their frequency can be varied.

FIG. 2 shows a diagram of a circuit 200 (or "VCO") in accordance with an embodiment of the present invention in which quadrature currents are generated and their frequency can be varied. The circuit 200 includes oscillators 202 and 204 and coupling module "m" 210 and coupling module "−m" 212. Each of these components may have an input port and an output port. The oscillator 204 may be connected at its output port, via circuit connection 205, to the input port of coupling module "m" 210. The coupling module "m" 210 may be connected at its output port, via circuit connection 211 to the input port of oscillator 202. The output port of oscillator 202 may be connected via circuit connection 203 to the input port of the coupling module "−m" 212. The output port of the coupling module "−m" 212 may be connected via circuit connection 213 to the input port of oscillator 204.

The oscillators 202 and 204 should be identical and may both be fixed frequency LC (inductor-capacitor) oscillators. The oscillators 202 and 204 are fixed frequency oscillators in the sense that when each oscillator is by itself it will oscillate at a fixed frequency. However, in accordance with an embodiment of the present invention when oscillators 202 and 204 are coupled together and when the coupling is varied the frequency will vary. When the oscillators 202 and 204 are coupled as in FIGS. 2 and 3, the system or loop will have one oscillation frequency which can be modified by modifying the coupling. Each oscillator may be modeled by a positive feedback loop with open loop gain being Gi, i=1, 2. Gain circuits 204a and 202a represent the gain of the oscillator 204 and 202 respectively. The oscillators 202 and 204 also include summation circuits 202b and 204b respectively.

The circuit 200 may also be comprised of a frequency control circuit 214. The control circuit 214 is connected to a control input 210a of the coupling module "m" 210 and a control input 212a of the coupling module "−m" 212.

Figure 3:
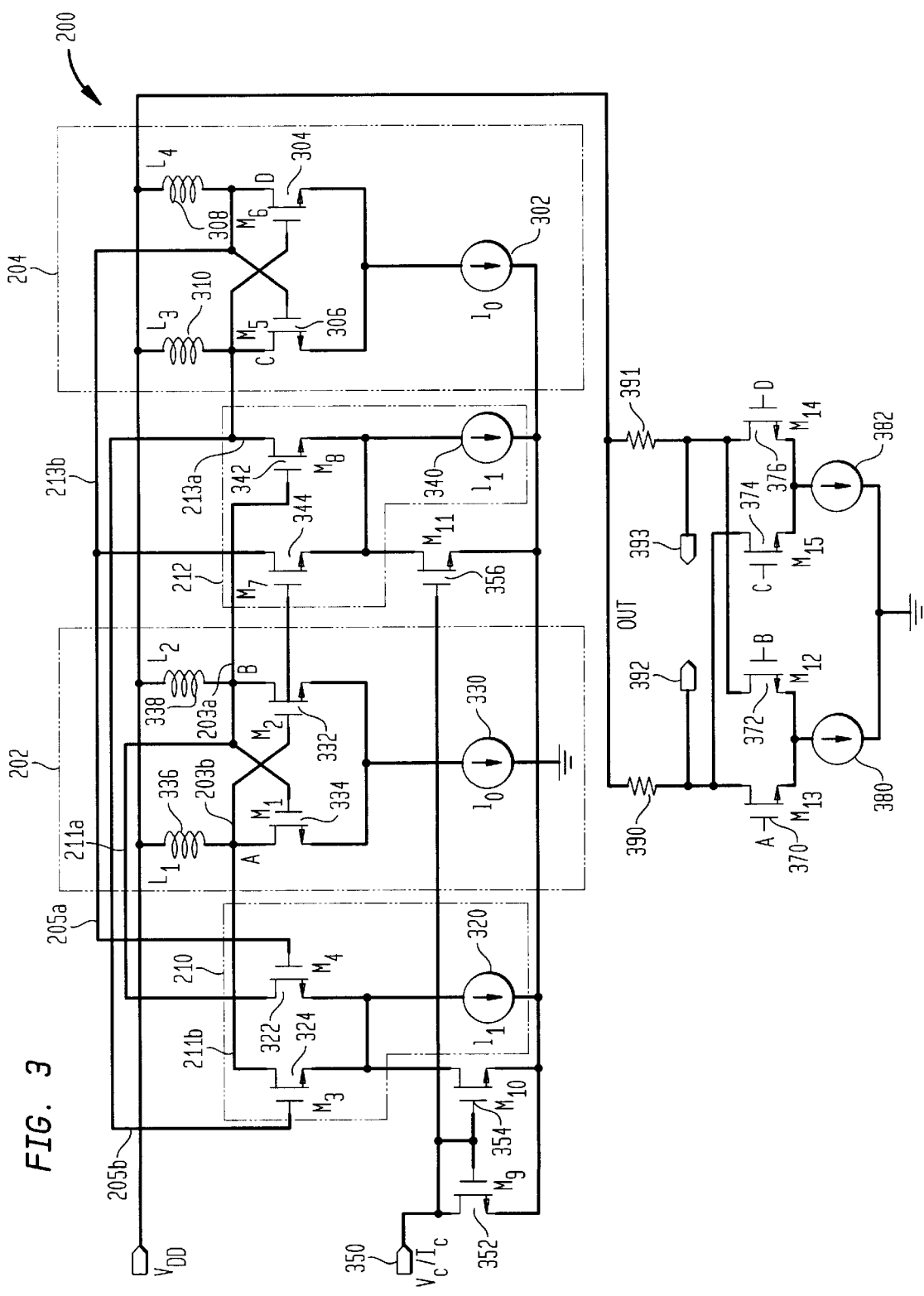
FIG. 3 shows a detailed implementation of the circuit in FIG. 2.

FIG. 3 shows a detailed implementation of the circuit 200 in FIG. 2. In FIG. 3 the oscillator 202 is shown comprised of current generator 330, transistors 332 and 334, and inductors 336 and 338. The transistors may be metal oxide semiconductor transistors. The gate of transistor 332 is shown connected to the drain of transistor 334. The gate of transistor 334 is shown connected to the drain of transistor 332. The sources of the transistors 332 and 334 are shown connected together and to the output of the current generator 330. The oscillator 204 can be similarly constructed with current generator 302, transistors 304 and 306 and inductors 308 and 310.

The coupling module "m" 210 may be comprised of transistors 322 and 324 and constant current generator 320 ("I1") In the prior art coupling of FIG. 1, the coupling "k" 110 and "−k" 112 have only fixed current sources. The prior art of FIG. 1 does not have any control circuitry similar to transistors 352, 354, 356, etc. The gates of the transistors 322 and 324 may be connected (via circuit connections 205b and 205a of circuit connection 205) to nodes C and D, respectively, of the oscillator 204. The drains of transistors 324 and 322 may be connected (via circuit connections 211b and 211a of circuit connection 211) to nodes A and B, respectively of the oscillator 202. The coupling module "−m" 212 is identical to the module 210 except for the manner in which circuitry is connected. If the coupling module "+m" 210 is said to be connected 0 degrees out of phase with itself, the coupling module "−m" 212 is said to be connected 180 degrees out of phase compared to "+m" 210. The coupling module "−m" 212 is comprised of transistors 342 and 344 and constant current generator 340. The drains of transistors 344 and 342 are connected to the nodes D and C respectively of the oscillator 204 (via circuit connections 213b and 213a, respectively of circuit connection 213. The gates of transistors 344 and 342 are connected to the nodes A and B of the oscillator 202 (via circuit connections 203b and 203a of circuit connection 203).

FIG. 3 also shows circuitry for implementing the control circuit 214 of FIG. 2. A variable voltage source Vc or variable current source Ic is shown as source 350. If a current source is used for source 350, transistors 352, 354, and 356 are also used to implement the control circuit. The transistors 352, 354, and 356 are used to convert the control signal voltage Vc to current.

If a voltage source is used for source 350, only transistors 354 and 356 are used.

The circuitry at the bottom of FIG. 3 shows only one differential output "OUT" because the two quadrature signals have been combined at this output "OUT". Only one combination output was used because the applicant only wanted to look at the frequency and thus a combination of the quadrature signals could be used, since they are both at the same frequency.

The oscillators 202 and 204 are preferably identical. The coupling modules 210 and 212 are preferably identical with the exception that module 210 provides a constant coupling "m" and module 212 provides a constant coupling "−m". "Coupling" can be defined as the ratio of the output from a first oscillator (such as oscillator 202) divided by the input fed to a second oscillator (such as oscillator 204) from a first oscillator (such as oscillator 202).

The present invention in most embodiments does not use varactors for the frequency tuning. In the prior art embodiment of FIG. 1 a varactor would be present in each of oscillators 102 and 104. In order to adjust the frequency the varactor would have to be varied. Typically a high quality varactor would need to be separate or outside of an integrated circuit or chip. This is inconvenient and makes manufacturing of circuitry difficult. An on chip varactor would typically be more expensive to achieve and of lower quality. An on chip varactor would also require a higher voltage to achieve a wider tuning range, i.e. in order to vary capacitance (and thus frequency) one would need to vary voltage and provide high voltages. High voltages can damage the circuitry and may be incompatible with transistor supply voltages.

In most embodiments of the present invention no extra capacitors are needed and low voltage operation is achieved. No precise prior knowledge of resonator frequencies is needed.

The two oscillators 202 and 204 may both fixed-frequency LC oscillators whose outputs are coupled to their inputs with the coupling coefficients $m_1$ and $m_2$, as shown in FIG. 2. Each oscillator may be modeled by a positive feedback loop gain being $G_i$, i=1,2, which are shown as gain circuits 204a and 202a respectively in FIG. 2. In the steady state, and if the two oscillators 202 and 204 synchronize to a single oscillation frequency $\omega$, the output of each oscillator must satisfy the following equations:

$$(X+m_2 Y)G_1(j_\omega)=X\text{:}X \text{ is the output of the First oscillator } \mathbf{204}; \quad (1)$$

$$(Y+m_1 X)G_2(j_\omega)=Y\text{:}Y \text{ is the output of the Second oscillator } \mathbf{202}; \quad (2)$$

where $m_1$ and $m_2$ are scalars, and X and Y are the output phasors for oscillator 204 and 202 respectively. If we further assume that oscillators 204 and 202 in FIG. 2 are identical ($G_1=G_2=G$) and $m_1=-m_2=M$, it can be shown that $X^2+Y^2=0$ and therefore $X=\pm jY$. This proves that the oscillatory system of FIG. 2 indeed provides quadrature outputs X and Y. The new oscillation frequency $\omega_{107}$ can be found by substituting $X=\pm jY$ into Equation (1) or (2):

$$(1\pm jm)G(j_\omega)=1 \quad (3)$$

Since the impedance $Z(j_\omega)$ of the oscillator's resonator is proportioned to $G(j_\omega)$, there exist two possible oscillation frequencies $\omega_1$ and $\omega_2$ for Equation (3), where $\phi(Z(j_{\omega 1}))=-\tan^{-1}m$ and $\phi(Z(j_{\omega 2}))=-\tan^{-1}m$. For the typical resonator with a lossy inductor, the magnitude of impedance peaks at a frequency higher than the resonant frequency $\omega_0$=square root of: $(\frac{1}{2\pi}LC)*(1-CR_S^2/L)$. As a consequence, a stable oscillation exists at $\omega_1$ while no sustaining oscillation at $\omega_2$ is permissible because the smaller impedance magnitude results in a loop gain less than one. Thus when a steady state is reached with a single oscillation frequency, Equation (3) is reduced to $(1+jm)G(j_\omega)=1$, and the oscillation frequency $\omega_1$ is determined by $\phi(G(j_{\omega 1}))=-\tan^{-1}m$. This suggests that the oscillation frequency can be tuned from $\omega_0$ to $\omega_1$ if the coupling coefficients ($m_1=-m_2$) are varied between 0 and m by a control voltage or by a control current source. See FIGS. 2 and 3.

The frequency tuning range is determined by the phase frequency characteristics of $G(j_\omega)$ and by the maximum deviation of m. The upper bound of m is limited by the phase noise performance, while the lower bound m* of m is set by the multi-oscillation phenomenon. This is because in practice it is impossible to have two perfectly matched oscillators and therefore each oscillator has a slightly different oscillation frequency when no coupling is applied. When m is smaller than m*, the coupling is too weak and the oscillators operate at different frequencies, giving rise to a multi-tone output signal as a result of nonlinear limiting in the feedback loops. The value of m* is a function of mismatch between $G_1$ and $G_2$.

Incorporating the architecture in FIG. 2, a fully balanced monolithic CMOS VCO using on-chip inductors and transistor parasitic capacitance as the resonator is shown in FIG. 3. The inductors have an unloaded Q of about 4 at 6 GHz. Since no capacitance variations are involved in the frequency tuning, the VCO can operate from a low supply voltage. $M_{1-2}$ and $L_{2-1}$ constitute one fixed frequency oscillator while $M_{5-6}$ and $L_{3-4}$ form the other. The two oscillators 202 and 204 as implemented in FIG. 3 are identical. The outputs (A and B) of the first oscillator 202 are coupled to the second oscillator 204 though the transconductance stage $M_{7-8}$ ("$m_1$", module 212 in FIG. 2) which injects the current signals to the nodes C and D. Conversely, the second oscillator 204 outputs (C and D) are coupled back (180° out of phase) to the nodes A and B of the first oscillator via the other transconductance stage $M_{3-4}$ ("$m_2$" module 210 in FIG. 2)

The coupling coefficient, m, is the ratio of $G_{M3-4}/G_{M1-2}$ (or $G_{M7-8}/G_{M5-6}$) where $G_{M1-2}$, $G_{M3-4}$, $G_{M5-6}$, $G_{M7-8}$ are the large-signal transconductances for the differential pairs $M_{1-2}$, $M_{3-4}$, $M_{5-6}$, and $M_{7-8}$ respectively. With constant current $I_0$, shown in FIG. 3, the VCO oscillation frequency can be tuned by varying the tail currents of $M_{3-4}$ (module 210) and $M_{7-8}$ (module 212). This can be accomplished by programming the current flowing in $M_{10-11}$ through $V_c$ (voltage-controlled mode) or $I_c$ (current-controlled mode), as shown in FIG. 3, $M_9$ (transistor 352) is optional for use in the current-controlled mode. To ensure a single oscillation frequency for the VCO in the phase-locked loop applications, $I_1$ is employed to set a minimum coupling coefficient $m^*=(I_1/I_0)^n$, where n is between 0.5 and 1. The different quadrature outputs are available at nodes A-B and C-D. For test purpose, the quadrature outputs can be summed together in the output stage $M_{13-15}$ (comprised of transistors 370, 372, 374, and 376) which provides equal loading and therefore introduces minimum mismatch between the two oscillators 202 and 204.

The VCO 200 can be fabricated in a 0.35-μm CMOS process. The VCO may operate at frequencies in the range of 6.41 GHz. For one embodiment the highest measured oscillation frequency is 6.53 GHz and the lowest measured synchronized frequency is 5.51 GHz, yielding a tuning range of 1.02 GHz. This is the highest frequency tuning range reported to date for a monolithic CMOS LC VCO.

I claim:

1. An apparatus comprising:

a first oscillator comprised of an input port and an output port, wherein the first oscillator produces at its output port a first signal;

a second oscillator comprised of an input port and an output port, wherein the second oscillator produces at its output port a second signal which is about ninety degrees out of phase with the first signal;

a first coupling module comprised of an input port, an output port, and a control input port;

a second coupling module comprised of an input port an output port, and a control input port;

wherein the input port of the first oscillator is connected to the output port of the first coupling module and the output port of the first oscillator is connected to the input port of the second coupling module;

wherein the input port of the second oscillator is connected to the output port of the second coupling module and the output port of the second oscillator is connected to the input port of the first coupling module;

further comprised of a frequency control circuit which is connected to the control input ports of the first and second coupling modules;

and wherein the frequency control circuit varies the coupling of the first coupling module and the second coupling module and thereby varies the frequency of the first signal and the second signal.

2. The apparatus of claim 1 wherein the first and second oscillators are of the same type.

3. The apparatus of claim 2 wherein the first and second oscillators are both fixed frequency oscillators.

4. The apparatus of claim 3 wherein the first and second oscillators are identical.

5. The apparatus of claim 1 wherein the frequency control circuit is comprised of a variable current source whose variable current causes the frequency of the first and second signals to vary.

6. The apparatus of claim 1 wherein the frequency control circuit is comprised of a variable voltage source whose variable voltage causes the frequency of the first and second signals to vary.

7. The apparatus of claim 4 wherein the first and second oscillators are both inductor-capacitor oscillators.

8. The apparatus of claim 1 wherein the first and second coupling modules are each comprised of a first and second fixed current source.

9. The apparatus of claim 1 wherein the first and second coupling modules are the same except that the first coupling module is connected to the first and second oscillators and the second coupling module is connected to the first and second oscillators, so that the first and second coupling modules are 180 degrees out of phase with one another.

10. A method comprising the steps of producing a first signal;

producing a second signal which is about ninety degrees out of phase with the first signal;

coupling the first signal with the second signal;

varying the coupling of the first signal with the second signal to vary the frequency of the first signal and the second signal.

11. The method of claim 10 wherein the first and second signals are produced by first and second oscillators.

12. The method of claim 11 wherein the first and second oscillators are of the same type.

13. The method of claim 12 wherein the first and second oscillators are fixed frequency type oscillators.

14. The method of claim 13 wherein the first and second oscillators are inductor-capacitor type oscillators.

15. The method of claim 10 wherein the coupling is varied by varying a current source.

16. The method of claim 10 wherein the coupling is varied by varying a voltage source.

17. An apparatus comprised of:

means for producing a first signal;

means for producing a second signal which is about ninety degrees out of phase with the first signal;

means for coupling the first signal and the second signal; and means for varying the frequency of the first and second signals by varying the coupling between the first and second signals.

18. The apparatus of claim 17 wherein the means for varying the frequency of the first and second signals includes a variable voltage source.

19. The apparatus of claim 17 wherein the means for varying the frequency of the first and second signals includes a variable current source.

* * * * *